United States Patent [19]

Schmelzer et al.

[11] 4,314,894
[45] Feb. 9, 1982

[54] METHOD OF MAKING A MAGNETIC MEMORY LAYER

[75] Inventors: Christoph Schmelzer, Seeheim; Reimar Spohr, Darmstadt-Wixhausen; Jens-Peter Krumme; Klaus Witter, both of Hamburg; Heinrich Heitmann, Rellingen, all of Fed. Rep. of Germany

[73] Assignee: U.S. Philips Corporation, New York, N.Y.

[21] Appl. No.: 207,820

[22] Filed: Nov. 17, 1980

Related U.S. Application Data

[62] Division of Ser. No. 924,369, Jul. 13, 1978, Pat. No. 4,274,935.

[30] Foreign Application Priority Data

Jul. 16, 1977 [DE] Fed. Rep. of Germany ....... 2732282

[51] Int. Cl.$^3$ ............................................. C23C 15/00
[52] U.S. Cl. ............................... 204/192 M; 156/628; 204/192 N; 427/128; 428/900
[58] Field of Search ............... 428/900; 427/127-132, 427/38-39, 289; 156/628; 204/192 M, 192 N

[56] References Cited

U.S. PATENT DOCUMENTS

| | | | |
|---|---|---|---|
| 3,792,452 | 2/1974 | Dixon et al. | 340/174 |
| 3,808,068 | 4/1974 | Johnson et al. | 156/8 |
| 3,996,571 | 12/1976 | Chang | 340/174 |
| 4,060,448 | 11/1977 | Nemiroff et al. | 156/653 |

FOREIGN PATENT DOCUMENTS

14976531 1/1978 United Kingdom.

OTHER PUBLICATIONS

"Modification of Magnetic Anisotropy in Garnets by Ion Implantation," Wolf et al., Applied Physics Let., vol. 19, No. 8, Oct. 15, 1971, pp. 298-299.

"Ferromagnetic Garnet Films for Magnetoptic Information Storage," Krumme et al., IEEE Trans on Magnetics, vol. Mag-11, No. 5, Sep. 1975, pp. 1097-1192.

"Ion Implantation in Semiconductors and Other Materials", Proceedings of the Third International Conference held at IBM Thomas J. Watson Research Center, 1972, Plenum Publishing Corporation, New York, pp. 505-525.

*Primary Examiner*—Bernard D. Pianalto
*Attorney, Agent, or Firm*—Marc D. Schechter

[57] ABSTRACT

A magnetic layer for storing information in the form of a fixed, two-dimensional array of magnetic domains. The magnetic layer can be magnetized in either of two opposite directions normal to the plane of the layer. The walls of the domains are fixed by local gradients in the value and direction of the magnetic anistropy and in the value and direction of the magnetic exchange energy of the magnetic layer. The local gradients may be caused by a relatively high defect density at the domain wall locations, by implanting ions into the magnetic layer at the locations of the domain walls thereby causing a local expansion of the crystal lattice of the layer, and/or by etching a multiplicity of nonconnected tapering channels in and substantially perpendicular to the plane of the magnetic layer at these locations. Where tapering channels are used, the magnetic layer is provided on a substrate such that the crystal lattice constant of the magnetic layer is different from the crystal lattice constant of the substrate. In another embodiment, the local gradients can be the result of the epitaxial growth of a magnetic layer on a substrate which has a plurality of nonconnected etched channels at the domain wall locations.

14 Claims, 8 Drawing Figures

1

METHOD OF MAKING A MAGNETIC MEMORY LAYER

This is a division, of application Ser. No. 924,369, filed July 13, 1978, U.S. Pat. No. 4,274,935.

BACKGROUND OF THE INVENTION

The invention relates to a magnetic layer on a substrate for storing information in the form of a fixed, two-dimensional array of magnetic domains, which layer can be magnetized in either of two opposite directions, the walls of the domains being fixed by local gradients in the magnetic properties of the magnetic layer.

Such a magnetic layer is used especially for magneto-optical memories as described, for example, in *IEEE Transactions on Magnetics*, Vol. Mag-11 No. 5, Sept. 1975, pp. 1097–1102. The magnetic layer has a magnetization perpendicular to the surface thereof and the stored binary information is given by the direction of the magnetization. In order to be able to store a large amount of information (for example $10^6$ bits/cm$^2$), the layer must be subdivided into separate information areas which preferably have the form of squares or circles arranged in rows and columns. The subdivision must be carried out so that the magnetic domain of an information area cannot expand into any adjacent information areas. This has been obtained, in known magnetic layers, by etching the layers down to the substrate near the information area boundaries. In this manner a large number of magnetic islands are formed on the substrate, one domain corresponding to one island, where the boundary of the domain is the edge of the island. As a result of this process a local gradient in the magnetic properties is formed at the junction between the magnetic material of the layer at the edge of the island and a non-magnetic material, generally air.

During the manufacture of the known magnetic layers an island-forming pattern of grooves is etched in the layer by using a mask which covers the layer in the region of the information areas and does not cover it at the area of the grooves to be etched away. In connection with the thickness of the magnetic layer required for a sufficiently large signal-to-noise ratio, the grooves must have a certain minimum width. On the other hand it is endeavored to minimize the size of the individual domains and the spaces between them so as to obtain a maximum storage density, that is a maximum amount of information per unit surface area. However, all the etching methods known so far provide only a restricted resolving power and a restricted steepness of the sides of the magnetic islands with a given etching depth, so that the need for a better structuring method exists. In addition, it would be advantageous to provide an improved structuring method which the formation of arbitrary two-dimensional domain patterns. This is an advantage when the magnetic layer is used in a system operating with multiple laser beams.

SUMMARY OF THE INVENTION

It is an object of the invention to provide a magnetic layer in which the domains are smaller and are situated closer together (in an arbitrary two-dimensioned pattern) than in the known magnetic memory layers. According to the invention, this object is achieved by providing local gradients in the magnetic properties of the magnetic layer which are variations in the value and/or direction of the magnetic anisotropy and/or of the magnetic exchange energy (with the value of the magnetization remaining substantially the same) and which have been caused by variations of the magnetic stress condition and/or lattice perfection through a considerable part of the thickness of the magnetic layer by means of radiating said layer with accelerated ions. The domains are thus separated from each other by magnetic walls the movement of which requires a comparatively large coercive field.

In order to obtain domain patterns having a high resolving power, several methods may be used within the scope of the present invention.

A first method of manufacturing the magnetic layer according to the invention comprises, prior to irradiating the magnetic layer, providing the layer with a mask in the form of a layer of a material having a high atomic weight, for example gold. The mask covers the entire magnetic layer except at the area where magnetic gradients are to be generated. The mask is removed after the iradiation. The use of masking technologies known from the manufacture of integrated semiconductor circuits may result in very fine structures.

Ions of various elements having different energies may be used for irradiating the layer in different doses. However, the depth of penetration may not be considerably smaller than the thickness of the magnetic layer (notably not smaller than one third of the thickness), while the number of the ions penetrating into the magnetic layer must be larger than $10^{15}$ ions per cm$^2$. The irradiated or implanted ions cause a high defect density in the material and as a result of this cause a pressure stress on the lattice at the irradiated areas, the stress centers continuing in the unexposed part of the layer. As a result of the magnetostrictive properties of the layer, a magnetic anisotropy gradient is obtained in the edge zone between nuclear track and implant, respectively, and undisturbed layer, so that in these places, with a correctly chosen external magnetic field, possibly also in no-field-conditions, the domain walls are held. For a sufficiently large wall coercive force $H_c^W$, said stress center will have to extend downwards down to the substrate.

From the book *Ion Implantation in Semiconductors and Other Materials*, Plenum Publishing Corporation, New-York, pp. 505–525, it is known per se to obtain a certain adhesive effect for freely movable domains by ion implantation. However, this reference does not concern magneto-optical memories with static domains, but memory systems with domains which are moved by external fields. The value and the mobility of the domains are determined by the composition of the magnetic layer and the external field, and may not be influenced by the ion implantation. In the magnetic layer according to the invention, on the other hand, the position and size of the domains are stabilized in the memory plane. Moreover, in the method known from that book, ion implantation takes place only in the uppermost part of the magnetic layer.

A second method of manufacturing a magnetic layer according to the invention comprises providing a magnetic layer on a substrate, which layer is in a mechanical stress condition caused in particular by a difference in crystal lattice constants between the substrate material and the material of the magnetic layer, irradiating the layer with high-energy ions which are accelerated to such an energy that the average depth of penetration is at least equal to the layer thickness (the number of ions penetrating into the magnetic layer preferably being approximately $10^6$–$10^9$ ions per cm$^2$), and that after the irradiation, subjecting the magnetic layer to an etching treatment in which the nuclear tracks of the ions are etched substantially the entire thickness of the magnetic layer.

High-energy ions upon penetrating the magnetic layer leave nuclear tracks of high defect density and of a diameter of approximately 100Å. The disturbed volume of the nuclear tracks can be removed by selective etching means so that non-connected channels of a cylindrical or prismatic cross-section are formed. The "capture cross-section" of the etched channels for magnetic walls extends far beyond the channel dimensions and can approach the "thickness" of the walls if layers with planar tensile or compressive misfit stress are used. Via magnetostriction, the stress halos operate as adhesive areas for magnetic walls. A similar adhering effect of the etched nuclear tracks on the magnetic walls would be produced if these tracks would be widened to approximately the wall thickness by a longer etching treatment. In that case, however, optical stray centers are formed so that read-out efficiency and magneto-optical contrast are reduced. The invention now enables a large adhering effect in layers which are under mechanical stress with comparatively low specific volume of the channels. If locally a magnetic domain is generated by a thermal pulse generated, for example, by means of a focused laser beam with simultaneous application of an external field, the magnetic wall surrounding the domain will stick to the nearest etching channels after the thermal pulse.

In a modified embodiment of the above-described method, prior to etching the magnetic layer is covered with a mask, of a material which is highly resistant to the etchant, except in places where magnetic gradients are to be generated, and the mask is removed after etching the nuclear tracks. As a result of this only the nuclear tracks are etched out which are not covered by the mask. Magnetically, the non-etched nuclear tracks have substantially no effect because their diameter (approximately 100 Å) is considerably smaller than the thickness of the walls ($\gtrsim 1000$ Å). In this manner a geometrically fixed storage pattern is obtained. In addition, optical stray losses in the area of the memory cells are absent. Very good resolving powers can also be obtained in comparatively thick layers (up to a thickness of approximately 10 $\mu$m), because undercutting does not take place and masks with high resolving power can be obtained. Therefore the dose can be chosen irrespective of the mask material used. A dose of $10^9$ cm$^{-2}$ results in an adequate value of the wall coercive force $H_c^W$. At this dose, a specific stray volume (the volume of the nuclear tracks divided by the total volume of the magnetic layer) of approximately $3 \cdot 10^{-4}$ is obtained, which is negligible with respect to the magneto-optical efficiency and the read-out contrast of a non-disturbed memory cell. A further embodiment of the above-described method is the use of an etching mask having a resolving power which is improved, for example, by one order of magnitude. As a result of this, a quasi-unstructured layer is compared with the information pattern is obtained which does not impose restrictions to the laser deflection device. This is possible because the mask-etching of nuclear tracks is associated with a high resolving power insofar as the dose is not chosen too high and the masks to be used can withstand the etchant.

For garnets, several selective etch solutions may be used for the etching treatment. It is advantageous to use wet etchants, such as an aqueous solution of 25% concentrated nitric acid and 25% concentrated acetic acid which is heated to between 50° C. and 80° C. Another etching treatment which may be used and which does not use a liquid etching solution is a sputter-etching process in an oxygen-containing rare gas atmosphere. Although the etching rate is reduced as a result of the presence of oxygen, the selectivity during etching is increased. The depth of the etching channels in the last-mentioned etching method, however, is smaller than in the first and the shape thereof corresponds to craters.

BRIEF DESCRIPTION OF THE DRAWINGS

Embodiments of the invention will now be described in greater detail, by way of example, with reference to the accompanying drawings, in which

FIG. 4A shows the variation of the wall energy $\Sigma_w$ near the implantation region in the layer shown in FIG. 4;

DESCRIPTION OF THE PREFERRED EMBODIMENTS

Figure 1:
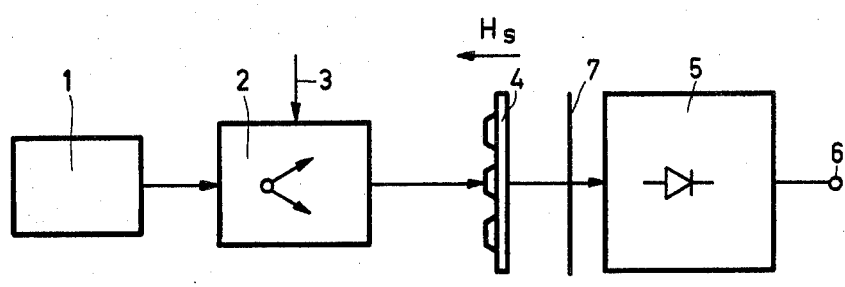
FIG. 1 shows diagrammatically a magneto-optical memory device.

In the memory device shown in FIG. 1, a laser 1 produces a linearly polarized light beam which is deflected into arbitrary directions in a light deflection device 2, for example an electro-optical polarization switch having birefringent prisms. The direction of the light deflection is determined by an address signal at an input 3.

Dependent on its direction, the deflected light impinges on one of the magnetizable areas on a memory disk 4 having on a non-magnetic substrate, a number of areas of a ferrimagnetic garnet material, in this example in the form of islands. On the basis of the manufacturing method, the material may have such an anisotropy that the magnetization vector is perpendicular to the surface, that is in the direction of the light or in the direction opposite thereto.

Figure 2:
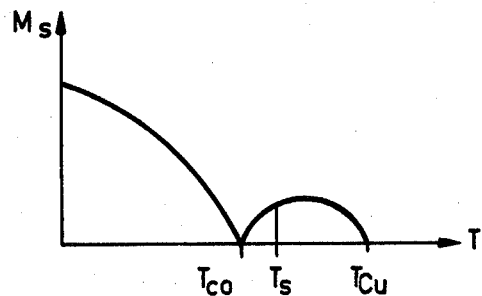
FIG. 2 is a graph showing the magnetization $M_s$ in a ferrimagnetic garnet material as a function of the temperature T.

Ferrimagnetic garnet materials have the property of having a compensation temperature $T_{co}$ lying below the Curie temperature $T_{Cu}$, at which the magnetization Ms disappears as shown in FIG. 2, but in which the optical activity is maintained. At $T_{co}$, the magnetization direction cannot be varied by typical magnetic fields. For recording information, an area on the memory disk 4 is heated by the light beam to a switching temperature $T_s$, at which the magnetization $M_s$ differs considerably from zero and simultaneously a switching magnetic field $H_s$ is applied. When the magnetization vector of the relevant area was previously in the direction of the light, it will now be switched in the opposite direction by the switching magnetic field of the same polarity. The surrounding areas will not be influenced by the switching magnetic field, provided the heating of the relevant area lasts so shortly that the surrounding areas are not heated when the field is applied. During reading, a polarized light beam, without an applied field, is directed onto the area to be read and the stored information is obtained from the sense of the rotation of the plane of polarization of the light beam emanating from the memory disk. The polarization of the light emanating from the memory disk 4 may be converted into brightness differences by an analyser 7 arranged before a photodiode 5 (which may also be a photodiode matrix), which difference then provide the information and which are converted into electrical signals via the photodiode 5 and are supplied to an output 6, if desired after amplification.

Figure 3:
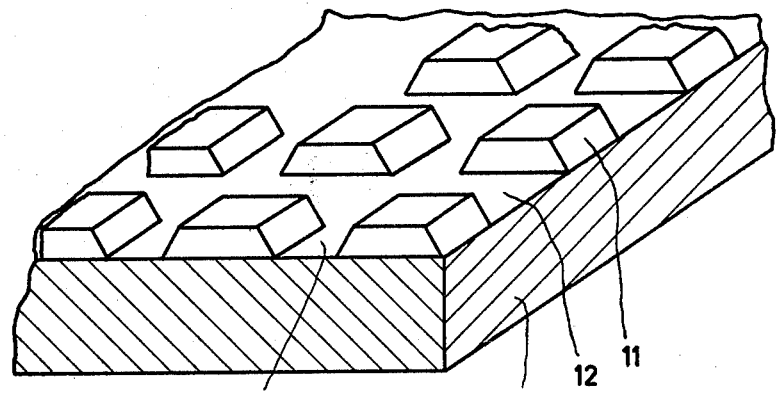
FIG. 3 is a perspective view of a part of a known memory layer having an island-shaped structure.

In order to make good use of the memory disk 4 and to be able to store as much information as posible, the surface area alloted to each information area should be minimized. From the memory device, the minimum size and the maximum density of the areas is limited by the smallest diameter of the light spot on the memory layer, on which spot the light beam can be focused, and by the accuracy of the deflection. In addition, the separate areas must be very stable both as regards size and position so as to enable a reproducible reading operation. It is known that uniaxial magnetic layers split up into domains of uniform direction of magnetization, adjacent domains having opposite magnetic polarity. Adjacent domains are separated by a magnetic wall. However, in the layers which are used for magneto-optical memories and which can be switched with low switching magnetic fields, the domains are often too large and in certain circumstances too easily movable. So they have to be reduced in size and confined by extra measures. As described in the publication *IEEE Transactions on Magnetics*, Vol. Mag. 11, No. 5 September b 1975, pp. 1097–1102 mentioned above, the ferrimagnetic garnet layer is therefore subdivided into separate islands, as is shown in FIG. 3. For this purpose, a ferrimagnetic garnet layer 11 is provided on a substrate 10 and is then covered with a mask which does not cover the garnet layer at the areas where the recesses 12 are to be formed. Next, the garnet layer is subjected to a complicated etching process which removes the garnet material in the non-covered places, so that the recesses 12 are formed. A domain present in an island 11 extends up to the edge of that island. However, magnetic walls cannot cross the edge so that each island represents a monodomain area which is independent of the surrounding islands and of the magnetization thereof.

Figure 4:
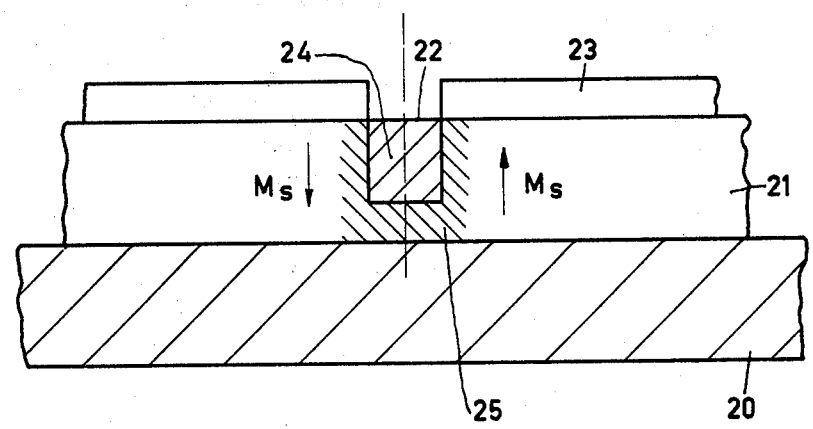
FIG. 4 is a sectional view of a part of a memory layer according to the invention having a domain boundary formed by a high-dose of ion irradiation.
Figure 4:
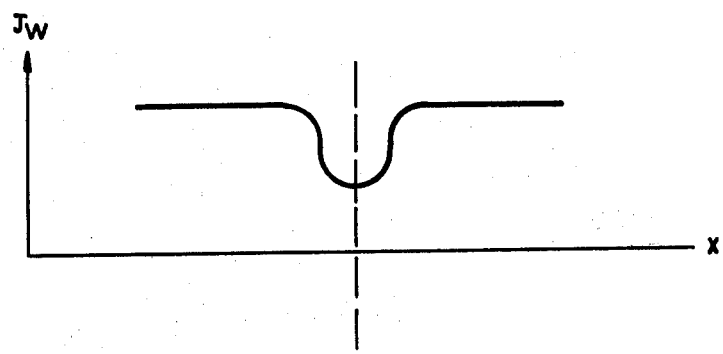

FIG. 4 shows an embodiment of a memory layer according to the invention in a given stage of manufacture. A ferrimagnetic garnet layer 21 has been provided, for example by liquid phase epitaxy, on a substrate 20 of a non-magnetic material. A mask in the form of a layer 23 consisting of a material having a high atomic weight, for example gold, is provided on the garnet layer 21 in such manner that the garnet layer 21 is covered with the exception of the place 22 at which the boundaries of the magnetic areas and hence the information areas are to be formed. The garnet layer 21, which is, for example, covered with a mask 23 of about 1.5 μm gold and which itself has a thickness of at most 3 μm, is irradiated with helium ions which are accelerated up to an energy of, for example, 350 keV. Their average penetration depth in the layer 21 is approximately 1 μm. As a result of this, the ions will penetrate into the layer 21 in the uncovered area 22 with an approximately constant density and leave a high defect density in the crystal lattice. With a radiation dose d of $>10^{15}$ per cm$^2$, a local quasi-homogeneous expansion of the crystal lattice of the layer 21 is obtained so that in the transition zone to the non-irradiated part of the layer underlying the mask 23 a stress gradient occurs which is sufficiently large to vary the magnetic properties of the layer at that area. FIG. 4 shows a shaded profile 24 of the implanted helium ions in the layer 21 which need not extend down to the bottom of said layer 21. However, as a result of the crystal lattice expansion a stress halo 25 (shown in a finer type of shading) is formed which has at least a range of 1 μm so that domain patterns in magnetic layers of approximately 2 to 3 μm thickness are sufficiently stabilized thereby. As a result of the mechanical stress condition in the area 22 of the layer 21 the magnetic anisotropy $K_u$ in case of a material having a negative magnetostriction constant is considerably reduced in this area and in addition the magnetic exchange energy A is reduced by the disturbed crystal lattice so that the wall energy $\Sigma_w$ (which is proportional to $\sqrt{A.K_u}$) has a minimum in the area 22 as is shown in FIG. 4A. As a result of this, a domain will expand in the layer 21 to this minimum when the external magnetic field is not too large and will not pass beyond it. The mask 23 consists of a layer of gold with a thickness of, say 1.5 μm, so that grooves of approximately the same size can be etched into the garnet by sputter etching in argon-oxygen plasma. The gold mask 23 is removed after the irradiation. This structuring method has the advantage of nearly perfect reproduction of the mask on the layer without the problems of undercutting.

Instead of a reduction of the wall energy $\Sigma_w$, in a material having a positive magnetostriction constant an increase of the wall energy $\Sigma_w$ occurs in the bombarded area of the magnetic layer. As a result of this, domain patterns can also be stabilized. One with ordinary skill in the art would understand that in the embodiment of FIG. 4, all that is needed is a relative lattice expansion at the domain boundaries. Thus, ions could be implanted throughout the layer so long as the concentration is greater at the domain boundaries.

A higher sensitivity for reversing the direction of magnetization under an external magnetic field is obtained by reducing the magnetic anisotropy in or around the memory cell by ion bombardment. If such a region, enclosed by ion-implanted area is heated to above the compensation temperature in the presence of an external magnetic field in the opposite direction, the magnetization in the edge area, if these are also heated, can more easily follow the external magnetic switching field and reverse so that a magnetic wall is formed which, by wall movement, will consequently also reverse the remainder of the area. Thus, by means of ion implantation an increased recording sensitivity of the memory layer thus formed can be obtained.

If the pinning of the magnetic walls to the edges of the individual area, that is to the interface with the bombarded areas, is to be improved, it is possible to remove the bombarded areas by etching. Selective etching methods may be used for this purpose, which will be described in greater detail hereinafter, and in which disturbed crystal areas are dissolved considerably more rapidly than non-disturbed areas. As a result of this, grooves which have nearly perpendicular sides and are essentially circular are formed without undercutting.

Figure 5:
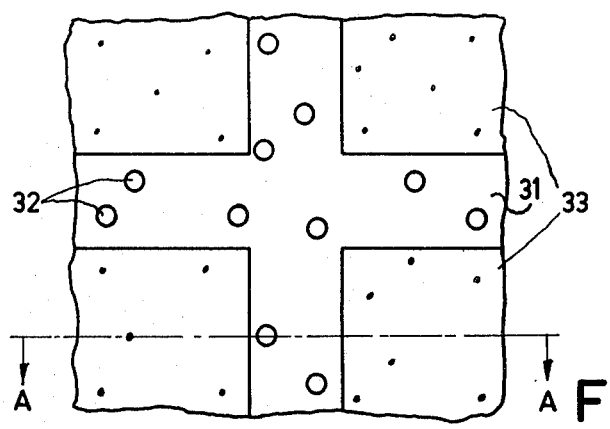
FIG. 5 is a plan view of a memory layer according to the invention after irradiating with a low-dose of ions and etching the nuclear tracks through a mask.
Figure 5A:
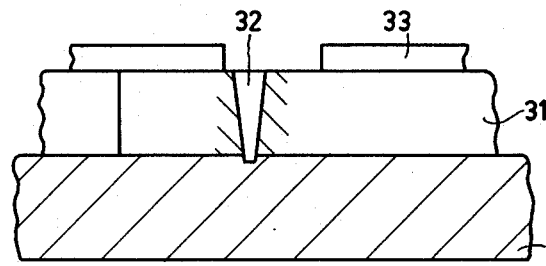
FIG. 5A is a sectional view taken on the line A—A in FIG. 5.

FIG. 5 is a plan view of another embodiment of a memory layer according to the invention and FIG. 5A is a cross-sectional view taken on the line A—A of FIG. 5. It is formed by a substrate 30 which may consist, for example, of $(Gd, Ca)_3 (Ga, Zr)_5O_{12}$ and is nonmagnetic. The substrate is provided, for example, with a ferrimagnetic monocrystalline garnet layer 31 having the composition $(Gd, Bi)_3 (Fe, Al, Ga)_5O_{12}$ which is provided by liquid epitaxy. The lattice constants of substrate 30 and layer 31 are not exactly equal. The garnet layer 31 is bombarded with ions having a sufficiently high energy so that the average depth of penetration is at least equal to the layer thickness but in a relatively small dose.

The garnet layer 31 is bombarded entirely with ions without the use of a mask. The individual ions leave nuclear tracks in the crystal structure of the garnet layer 31 with a diameter on the order of magnitude of 100 Å in which the crystal lattice is strongly disturbed. These tracks however, not yet have any noticeable effect on the magnetic walls in the layer because these dimensions are far below the wall thickness of the domains. Selective etching solutions were prepared, inter alia, a hot aqueous solution of 25% by volume of concentrated $HNO_3$ and 25% by volume of concentrated $CH_3COOH$ in which the disturbed crystal structure has a very much larger solubility than the non-disturbed crystal structure (in this case, a few hundred times larger). Also when sputter-etching in an atmosphere of argon and oxygen, the disturbed crystal structure is preferentially removed to a stronger extent than the non-disturbed structure. Thus if an irradiated garnet layer is treated, for example, in the above-mentioned liquid etching solution at 70° for 30 minutes, the nuclear tracks are etched out as tapering channels 32. Channels 32 are not connected to each other and are substantially perpendicular to the plane of layer 31. With a sufficiently high ion energy these channels may extend through the layer into the substrate 30. Such etching channels 32 and a cross-section of one of them are shown in FIG. 5 and FIG. 5A, respectively. In this case the garnet layer 31 after bombardment with ions is covered by a mask 33. The material of which is highly resistent to the etchant used. The layer was then subjected to an etching treatment. As a result of this, only the nuclear tracks which were not covered by the mask 33 were etched away to channels. The areas with non-etched nuclear tracks represent the memory cells in which the specific volume of the disturbed regions is very small. It is advantageous that the stress halos around the channels represent minima of the wall energy, that is with compressive stress the layer should have a positive magnetostriction constant λ with tensile stress a negative magnetostruction constant λ. In fact, the magnetic walls adhere particularly strongly to the etched channels when the garnet layer 31 is under a mechanical stress condition. A compressive stress, for example, may be obtained in the layer by choosing a crystal lattice constant for the garnet layer 31 which is slightly larger (for example 0.02 Å) than that of the substrate 30. At the areas of the etched-away channels 32 the compressive stress is relieved at least partly, so that in the proximity of an etched channel a strain halo occurs as is denoted by the shaded area in the sectional view of FIG. 5A in the proximity of the channel 32. As a result of these mechanical stress gradients, a gradient of magnetic anisotropy occurs via the magnetostriction. As a result of this the wall energy $\Sigma_w$ varies with negative λ as shown in FIG. 4 so that a domain is hindered in the movement thereof by such a channel. When such channels are sufficiently dense, the wall can be moved only by larger magnetic fields. However, the stress halos should not be allowed to overlap each other so as to cause the full anisotropy gradient act on the wall. Consequently, in this case, ion doses $>10^9/cm^2$ do not seem to be efficacious.

Hence it is possible that in areas not etched through the mask 33 domains can exist independently of each other, without substantially influencing each other. The minimum stable size of the domains stabilized by etched nuclear tracks depends on the wall energy and on the anisotropy gradient with an optimum ion dose. With an optimum dose the pattern resolution can be increased by increasing the lattice mismatch, by increasing the etching time, or by choosing a material having a larger magnetostriction constant. In fact, in all cases the effective cross-section of the channels is increased. It is also efficacious to reduce the overall uniaxial magnetic anisotropy. When the dose is made much larger than $10^9$ $cm^{31\ 2}$, quasi-consistent apertures are formed in the crystal lattice which approach the method shown in FIG. 3.

Figure 6:
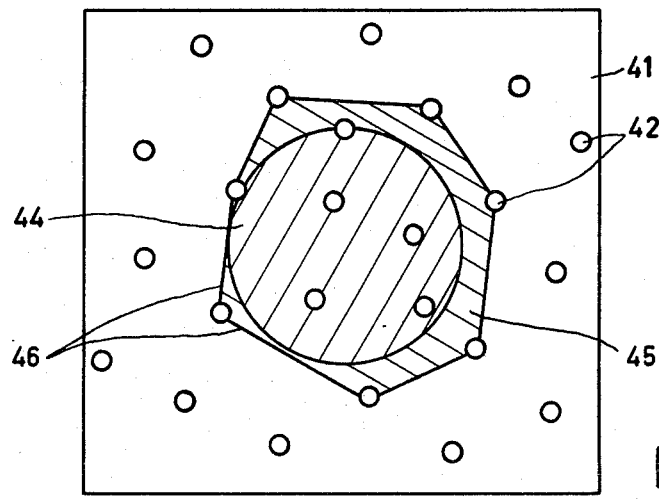
FIG. 6 shows a domain wall adhering to etched nuclear tracks when no etch mask is used.

FIG. 6 is a plan view of still another embodiment of a memory layer according to the invention. During the manufacture of the layer 41 a mask was not used neither during irradiation with ions nor during etching. As a result of this all nuclear tracks which have been formed in the memory layer 41 by ion bombardment have then been etched away to channels 42. The advantage of this method is that thus no fixed structure for the information areas is given beforehand.

It is assumed that the layer 41 in FIG. 6 is locally heated for a short time by an approximately circular light spot which is shown by the shaded area 44, while simultaneously a magnetic field of a sufficient value having a direction opposite to the magnetization present is applied for switching. The magnetization in the heated area will invert, that is to say, a domain having an approximately cylindrical wall is formed. Because for the layer 41 a material is used in which only very large domains can be maintained without disturbances (the magnetization is small) the formed domain will hence expand until the walls outside the light spot are held by channels. The domain 45 formed by expansion is bounded by the straight connecting lines 46 between the channels 42 outside and on, respectively, the edge of the light spot. After switching off the laser source, said domain remains stable on the spot due to increased wall pinning at the channels, provided that the domain diameter and the coercive field $H_c^W$ are not too small. Apart from the fact that the method for manufacturing this embodiment of the invention is simpler, this embodiment is also advantageous in that the light deflection device need not be specially designed to cooperate with a previously given structure of the layer. The areas whose magnetization has been reversed and which each comprise a piece of information are determined by the light deflection device itself. The ion dose used in the bombardment is determined to assure that the individual channels 42 will be sufficiently close together so that smaller domains will not collapse after nucleation by the heat pulse. Hence for a domain size of less than 10 μm a dose of approximately $10^7$ ions per $cm^3$ or more is necessary. On the other hand, the dose may not be too large either in order that the stress halos around the individual channels 42 do not overlap each other. For this reason, the maximum dose with a mechanically prestressed layer is restricted to approximately $10^9$ ions per cm². In the case of the method of FIG. 5 however, considerably larger doses may be used since there a stress gradient is generated at the edges of the implanted regions. In the embodiments described with reference to FIGS. 5 and 6 in which the pinning centers for the magnetic walls are obtained by bombardment with ions of low dose and a subsequent selective etching treatment, the recording sensitivity increases. At the channels formed by etching, a homogeneous stress condition incorporated in the magnetic layer by a lattice mismatch at the substrate may relax so that an anisotropy gradient occurs. So if the material of the magnetic layer has a negative magnetostriction constant and valleys having a tensile stress occur around the etched channels, magnetic walls can be nucleated there by thermomagnetic switching in reduced magnetic fields. The walls then move across the memory cell to complete the switching. In the magnetic layers shown in FIG. 6 in which all nuclear tracks are etched and hence also the tracks lying within the memory area, this effect is particularly useful. In memory layers shown in FIG. 5 this effect occurs only if, upon heating an area by means of a laser beam, the edge area, that is a part of the area with the etched channels between the memory areas, is also noticeably heated.

In an example of the invention, an epitaxially provided irongarnet layer having the composition $(Gd,Bi)_3(Fe,Ga,Al)_5O_{12}$ was used in which the crystal lattice defect matching to the substrate was slightly larger than 1%. The uniaxial anisotropy of the non-disturbed layer was smaller than $10^3$ erg/cm³ and the magnetic compensation temperature $T_{co}$ was between approximately 0° and 40° C. With layer thicknesses up to approximately 3 μm magnetic domain patterns having arbitrary planar distribution and diameters smaller than 10 μm could be stored after bombardment of the layer with a dose larger than $10^7$ ions per cm².

Instead of the bombardment of the magnetic layer with ions to generate crystal lattice disturbances, the monocrystalline substrate on which the magnetic layers are provided epitaxially can also be disturbed by ion bombardment. If selectively etched these disturbances propogate into the layer during the growth thereof and behave as if nuclear tracks were formed in the magnetic film after growth.

So within the scope of the invention, magnetic memory materials can be manufactured in various manners in which domains of small dimensions are restricted to fixed locations in the plane of the memory layer and can be switched. In all embodiments of the invention the domains and the walls thereof, respectively, are held by irregularities in the memory layer which are produced by bombardment with ions. These irregularities produce a gradient in the magnetic properties, that is in the anisotropy, in the magnetic exchange energy or in both. The correct pinning action of the imperfections produced in the manner described has not been described separately, because this does not seem to be necessary for the principle of the invention and for a good understanding thereof.

The invention is not restricted to ferrimagnetic garnet layers or to magnetic layers manufactured by liquid phase epitaxy, albeit that when epitaxial monocrystalline garnet layers are used as a magneto-optical medium the invention is particularly useful because normally the domain wall coercive force of such garnet layers, due to the absence of grain limits, is much too small to permit high storage densities.

What is claimed is:

1. A method of manufacturing a magnetic layer for storing information in the form of a fixed two-dimensional array of magnetic domains, which layer can be magnetized in either of two opposite directions, the boundaries of the domains being defined by local gradients in the magnetic properties of the magnetic layer, said magnetic properties including the value and direction of the magnetic anisotropy and the value and direction of the magnetic exchange energy, with the value of the magnetization remaining substantially unaltered, said method comprising the step of bombarding the magnetic layer with accelerated ions, the concentration of bombarding ions being greater at the domain boundaries than at other areas of the layer.

2. A method as claimed in claim 1, wherein the magnetic layer is bombarded with ions solely at the domain boundaries.

3. A method as claimed in claim 2, wherein prior to bombarbing the magnetic layer the method comprises covering the magnetic layer, except in places where magnetic gradients are to be generated, with a mask comprising a material having a high atomic weight.

4. A method as claimed in claim 3, wherein the ions have sufficient energy such that the depth of the penetration is not less than on-third of the thickness of the magnetic layer.

5. A method as claimed in claim 4, wherein the density of ions implanted in the layer by the bombardment is at least $10^{15}$ ions per cm².

6. A method as claimed in claim 5, wherein the magnetic layer exhibits negative magnetostriction.

7. A method of manufacturing a magnetic layer for storing information in the form of a fixed two-dimensional array of magnetic domains, said layer having a crystal lattice constant, which layer can be magnetized in either of two opposite directions, the boundaries of the domains being defined by local gradients in the magnetic properties of the magnetic layer, said magnetic properties including the value and direction of the magnetic anisotropy and the value and direction of the magnetic exchange energy, with the value of the magnetization remaining substantially unaltered, said method comprising:
    providing the layer on a substrate having a crystal lattice constant, said substrate lattice constant being different from the lattice constant of the layer, to produce a mechanical stress condition between the substrate and the layer;
    bombarding the layer with ions to produce nuclear tracks, said ions having sufficient energy such that their average depth of penetration is at least equal to the thickness of the layer; and
    etching the nuclear tracks substantially through the entire thickness of the layer to produce a multiplicity of nonconnected tapering channels in the layer, said channels extending substantially perpendicular to the layer.

8. A method as claimed in claim 7, wherein the density of the ions impacted into layer by the bombardment is approximately $10^6$ to $10^9$ ions per cm².

9. A method as claimed in claim 8, wherein prior to etching the method comprises the step of covering the layer, except in places where magnetic gradients are to be formed, with a mask of a material which is highly resistant to the etching step.

10. A method as claimed in claim 9, wherein the masking material comprises a photolacquer.

11. A method of manufacturing a magnetic layer for storing information in the form a fixed two-dimensional array of magnetic domains, said layer having a crystal lattice constant, which layer can be magnetized in either of two opposite directions, the boundaries of the domains being defined by local gradients in the magnetic properties of the magnetic layer, said magnetic properties including the value and direction of the magnetic anisotropy and the value and direction of the magnetic exchange energy, with the value of the magnetization remaining substantially unaltered, said method comprising:

providing a substrate with a crystal lattice constant;

bombarding the substrate with ions to produce nuclear tracks;

etching the nuclear the tracks in the substrate to produce a multiplicity of nonconnecting tappering channels therein; and epitaxially growing the magnetic layer on the etched substrate.

12. A method as claimed in claim 1, wherein the lattice constant of the substrate is different from the lattice constant of the magnetic layer to produce a mechanical stress condition between the substrate and the layer.

13. A method as claimed in claim 9 or 12, wherein the etching is performed with an aqueous solution comprising 25% concentrated nitric acid and 25% concentrated acetic acid, heated to greater than 50°.

14. A method as claimed in claim 9 or 12, wherein the etching is sputter etching in an oxygen-containing rare gas atmosphere.

* * * * *